(12) United States Patent
Lin et al.

(10) Patent No.: US 11,732,981 B2
(45) Date of Patent: Aug. 22, 2023

(54) HEAT DISSIPATION DEVICE

(71) Applicant: COOLER MASTER CO., LTD., Taipei (TW)

(72) Inventors: Chia-Yu Lin, Taipei (TW); Chang-Yu Hsieh, Taipei (TW); Shan-Yin Cheng, Taipei (TW); Hsiang-Fen Chou, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 32 days.

(21) Appl. No.: 17/834,821

(22) Filed: Jun. 7, 2022

(65) Prior Publication Data

US 2022/0299277 A1    Sep. 22, 2022

Related U.S. Application Data

(62) Division of application No. 16/821,259, filed on Mar. 17, 2020, now Pat. No. 11,384,999.

(30) Foreign Application Priority Data

May 31, 2019 (TW) ................................. 108119018

(51) Int. Cl.
*F28D 21/00* (2006.01)
*F28F 13/00* (2006.01)
(Continued)

(52) U.S. Cl.
CPC .............. *F28F 13/06* (2013.01); *F28F 13/00* (2013.01); *F28F 2013/001* (2013.01); *F28F 2215/08* (2013.01); *F28F 2250/10* (2013.01)

(58) Field of Classification Search
CPC ............ H01L 23/467; F28D 2021/0029; F28F 2013/006; F28F 2013/005; F28F 13/003;
(Continued)

(56) References Cited

U.S. PATENT DOCUMENTS 6,269,003 B1 *   7/2001  Wen-Chen ............ H01L 23/467
                                                          257/722
2006/0215364 A1 * 9/2006 Le ......................... H01L 23/467
                                                          257/E23.099
(Continued)

FOREIGN PATENT DOCUMENTS

JP          2010098004 A      4/2010

*Primary Examiner* — Frantz F Jules
*Assistant Examiner* — Jason N Thompson
(74) *Attorney, Agent, or Firm* — Maschoff Brennan (57) ABSTRACT

This disclosure provides a heat dissipation device configured to be in thermal contact with a heat source. The heat dissipation device includes a heat dissipation body and a cover plate. The heat dissipation body has at least one vertical channel. The heat dissipation body is configured to be in thermal contact with the heat source. The cover plate includes a first layer and a second layer that are stacked on each other. The first layer is stacked on the heat dissipation body and covers the at least one vertical channel. A thermal conductivity of the first layer is larger than a thermal conductivity of the second layer. The cover plate has at least one first through hole penetrating through the first layer and the second layer and connecting to the at least one vertical channel.

30 Claims, 11 Drawing Sheets

(51) Int. Cl.
*H01L 23/467* (2006.01)
*F28F 13/06* (2006.01)

(58) Field of Classification Search
CPC ............. F28F 2013/001; F28F 2270/00; F28F 2215/08
See application file for complete search history.

(56) References Cited

U.S. PATENT DOCUMENTS

| | | | |
|---|---|---|---|
| 2007/0068659 A1* | 3/2007 | Hwang | H01L 23/427 |
| | | | 165/104.33 |
| 2009/0303735 A1 | 12/2009 | Chen | |
| 2012/0160462 A1 | 6/2012 | Guan | |
| 2013/0240189 A1 | 9/2013 | Huang | |
| 2013/0292105 A1* | 11/2013 | Salamon | H01L 23/467 |
| | | | 165/185 |
| 2014/0224466 A1* | 8/2014 | Lin | H01L 23/3737 |
| | | | 165/185 |
| 2014/0305142 A1 | 10/2014 | Aman | |
| 2016/0282057 A1* | 9/2016 | Hongo | H01L 23/36 |
| 2016/0313072 A1* | 10/2016 | Okuaki | F28F 3/02 |
| 2018/0164049 A1 | 6/2018 | Okuaki | |
| 2019/0357388 A1* | 11/2019 | Sato | H05K 7/20409 |

* cited by examiner

HEAT DISSIPATION DEVICE

CROSS-REFERENCE TO RELATED APPLICATIONS

This patent application is a divisional patent application of U.S. patent application Ser. No. 16/821,259, filed on Mar. 17, 2020 and entitled "HEAT DISSIPATION DEVICE", which is a non-provisional application claims priority under 35 U.S.C. § 119(a) on Patent Application No(s). 108119018 filed in Taiwan, R.O.C. on May 31, 2019, the entire contents of which are hereby incorporated by reference.

TECHNICAL FIELD

The disclosure relates to a heat dissipation device, more particularly to a heat dissipation device having at least one vertical channel.

BACKGROUND

In recent years, electronic devices, such as laptop computers, tablet computers, and cellular phones, have become compact and slim yet powerful, so internal heat dissipation devices for such electronic devices have become smaller than before. Therefore, it is always desirable to find a way to effectively cool the electronic devices by small sized heat dissipation devices.

In general, the conventional heat dissipation device includes a copper or aluminum made base plate and heat dissipation fins disposed on the base plate. The heat dissipation device has a limited thermal contact surface, so it is known that increasing the flow rate of working fluid flowing over the heat dissipation device is one of the critical factors to improve the cooling efficiency of the heat dissipation device. For example, some use a fan to increase the flow rate of working fluid, but a slim and compact electronic device does not have an enough space for accommodating a fan, so such electronic device still uses natural convection for cooling. Therefore, the disclosure seeks to overcome one or more of the above disadvantages.

SUMMARY

The disclosure relates to a heat dissipation device for improving the cooling efficiency of heat dissipation component under natural convection.

An embodiment of the disclosure provides a heat dissipation device configured to be in thermal contact with a heat source. The heat dissipation device includes a heat dissipation body and a cover plate. The heat dissipation body has at least one vertical channel and is configured to be in thermal contact with the heat source. The cover plate includes a first layer and a second layer that are stacked on each other. The first layer is stacked on the heat dissipation body and covers the at least one vertical channel. A thermal conductivity of the first layer is larger than a thermal conductivity of the second layer. The cover plate has at least one first through hole penetrating through the first layer and the second layer and connecting to the at least one vertical channel.

Another embodiment of the disclosure provides a heat dissipation device configured to be in thermal contact with a heat source. The heat dissipation device includes a heat dissipation body and a cover plate. The heat dissipation body has at least one vertical channel and is configured to be in thermal contact with the heat source. The cover plate is stacked on the heat dissipation body and covers the at least one vertical channel. A thermal conductivity of the heat dissipation body is larger than the thermal conductivity of the cover plate. The cover plate has at least one first through hole connecting to the at least one vertical channel.

Still another embodiment of the disclosure provides a heat dissipation device configured to be in thermal contact with a heat source. The heat dissipation device includes a heat dissipation body and a heat insulation film. The heat dissipation body includes a first thermally conductive plate, a second thermally conductive plate and a plurality of fins that are integrally formed with one another. The plurality of fins are located between the first thermally conductive plate and the second thermally conductive plate. The first thermally conductive plate, the second thermally conductive plate and the plurality of fins form a plurality of vertical channels therebetween. The first thermally conductive plate is configured to be in thermal contact with the heat source. The second thermally conductive plate has a plurality of first through holes connecting to the plurality of vertical channels. The heat insulation film has a plurality of second through holes and is stacked on a side of the second thermally conductive plate facing away from the first thermally conductive plate. The plurality of second through holes are respectively connected to the plurality of vertical channels via the plurality of first through holes.

According to the heat dissipation devices discussed above, due to the composite material of the cover plate or the heat dissipation body, or the thermal insulation part, the amount of heat transferred to the fluid inside the vertical channels will be more than that transferred to the fluid outside the vertical channels, such that the fluid inside the vertical channels will flow faster than the fluid outside the vertical channels. According to the Bernoulli's equation, the higher velocity of the fluid inside the vertical channels will result in a pressure lower than that in the space outside the vertical channels, and which will draw the air outside the vertical channels into the vertical channels to increase the flow rate of the fluid in the vertical channels. Therefore, during the operation of the heat source, the flow rate of the fluid flowing through the vertical channels can be increased. The increased flow rate of the fluid in the vertical channels can help improve the cooling efficiency of the heat dissipation device to the heat source under natural convection.

The above embodiments and following detailed descriptions are considered as examples of the application of the principles of the disclosure, which help to facilitate comprehension of the claims but are not limited to any specific details of these embodiments.

DETAILED DESCRIPTION

Figure 1:
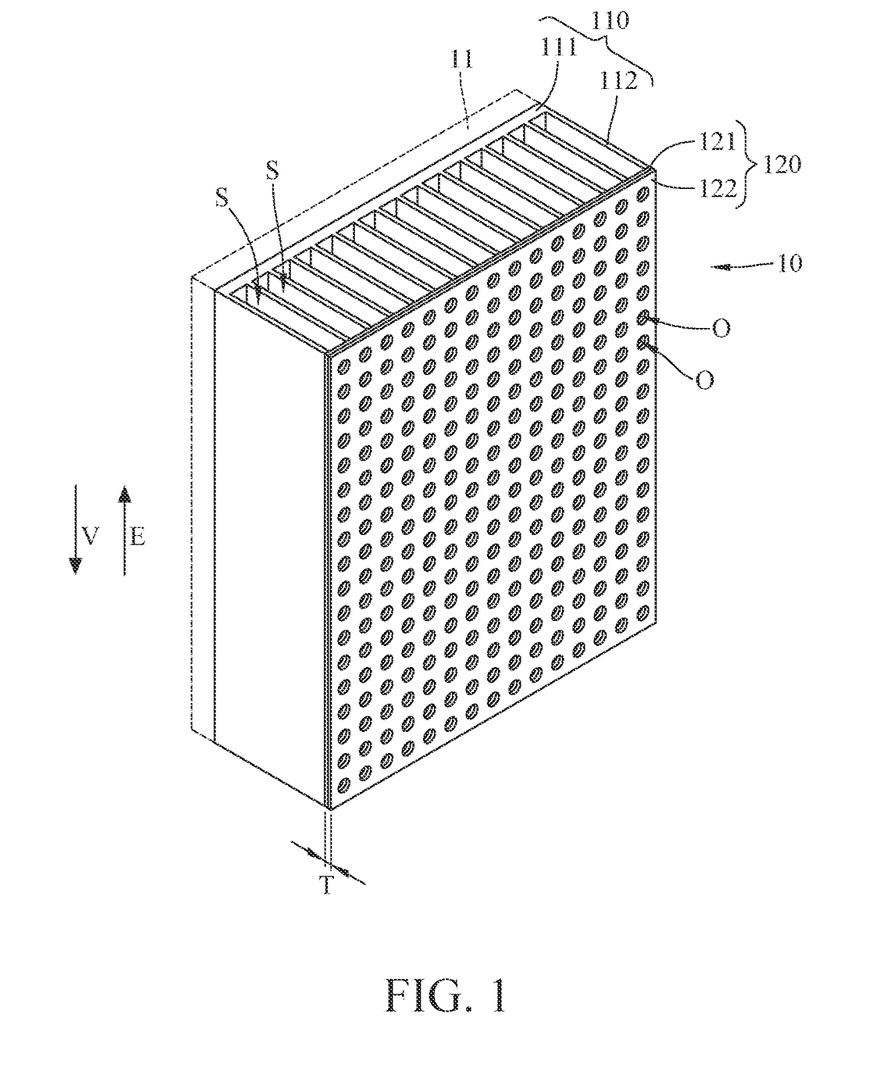
FIG. 1 is a perspective view of a heat dissipation device according to a first embodiment of the disclosure.
Figure 2:
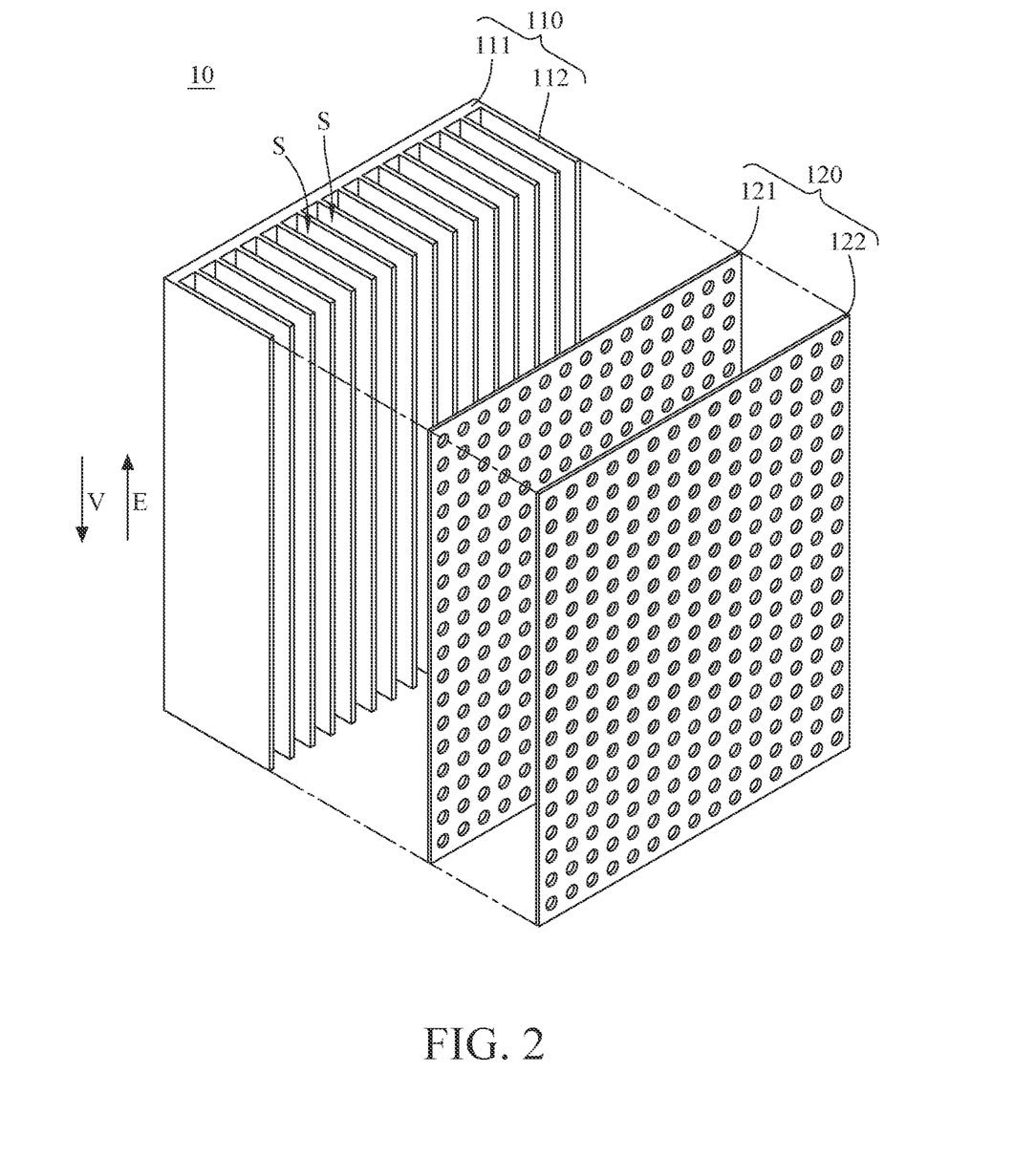
FIG. 2 is an exploded view of the heat dissipation device in FIG. 1.

Please refer to FIG. 1 and FIG. 2. FIG. 1 is a perspective view of a heat dissipation device according to a first embodiment of the disclosure. FIG. 2 is an exploded view of the heat dissipation device in FIG. 1.

This embodiment provides a heat dissipation device 10 configured to be in thermal contact with a heat source 11. The heat dissipation device 10 includes a heat dissipation body 110 and a cover plate 120. The heat dissipation body 110 may include copper and have a thermal conductivity of approximately 390 W/mk to 401 W/mk. The heat dissipation body 110 is configured to be in thermal contact with the heat source 11. The heat source 11 may be a central processing unit, battery or light emitting diode. The heat dissipation body 110 has at least one vertical channel S. In detail, the heat dissipation body 110 includes a base 111 and a plurality of heat dissipation fins 112. The heat dissipation fins 112 protrude from the base 111, and every two adjacent heat dissipation fins 112 are spaced apart by a vertical channel S. As can be seen, the heat dissipation body 110 has a plurality of vertical channels S, but it is noted that the disclosure is not limited to the quantity or size of the vertical channels S.

Each vertical channel S has an extension direction E parallel to a vertical direction V, where the vertical direction V is the direction of gravitational force. However, the disclosure is not limited thereto; in other embodiments, the extension direction of the vertical channels may have an acute angle to the vertical direction. It is noted that the extension direction of the vertical channels is not limited to be parallel to or has an acute angle to the vertical direction as long as it is not perpendicular to the vertical direction.

The cover plate 120 is stacked on the heat dissipation fins 112, and the cover plate 120 and the base 111 are respectively located on two opposite sides of the heat dissipation fins 112. The cover plate 120 may be connected to the heat dissipation fins 112 by press fit, riveting or welding. In the case that the cover plate is connected to the heat dissipation fins by press fit, the cover plate may have slots respectively for the heat dissipation fins to mount on the cover plate. The cover plate 120 may have a thickness T ranging approximately between 1 millimeter and 5 millimeters. In detail, the cover plate 120 includes a first layer 121 and a second layer 122. The first layer 121 may include copper and have a thermal conductivity of approximately 390 W/mk to 401 W/mk. The first layer 121 is stacked on the heat dissipation body 110 to cover the vertical channels S. The second layer 122 may include plastic and have a thermal conductivity lower than 1 W/mk. The second layer 122 is stacked on a side of the first layer 121 facing away from the heat dissipation body 110, that is, the first layer 121 is located between the heat dissipation body 110 and the second layer 122. In this embodiment, the thermal conductivity of the first layer 121 is at least one hundred times higher than that of the second layer 122, but the disclosure is not limited thereto. In other embodiments, the thermal conductivity of the first layer may be at least twenty times higher than that of the second layer. In addition, in this embodiment, the first layer 121 and the heat dissipation body 110 have the same material, but the disclosure is not limited thereto. In other embodiments, the first layer and the heat dissipation body may be made of different materials so that the first layer may have a thermal conductivity higher or lower than that of the heat dissipation body.

The cover plate 120 has a plurality of first through holes O penetrating through the first layer 121 and the second layer 122 and connecting to some of or all of the vertical channels S.

Figure 3:
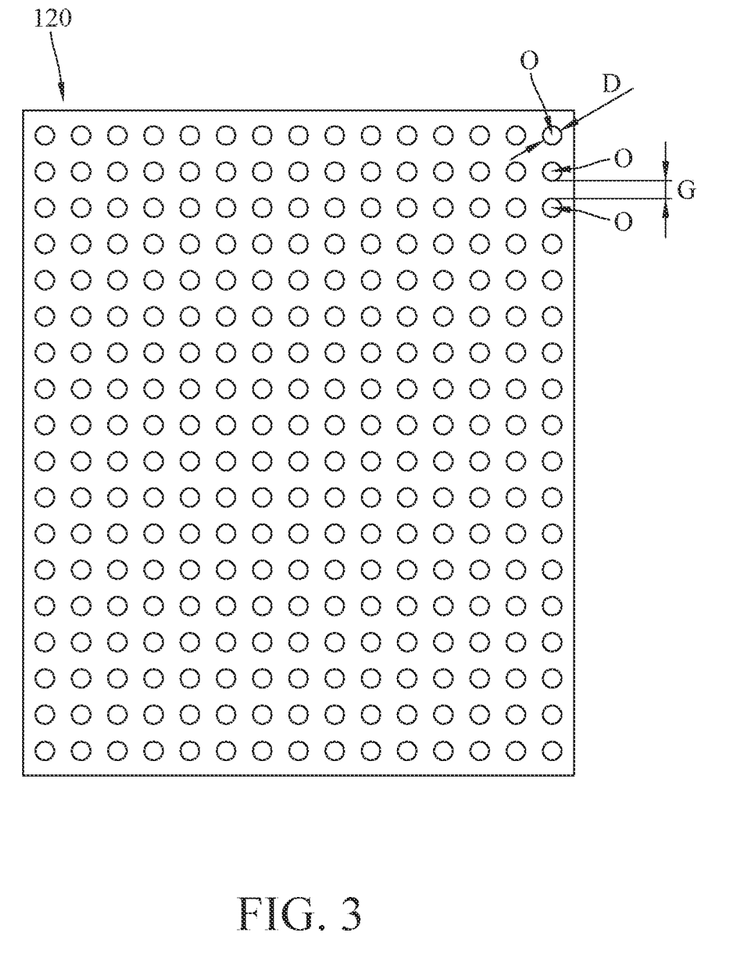
FIG. 3 is a planar view of a cover plate in FIG. 2.

Please refer to FIG. 3. FIG. 3 is a planar view of a cover plate in FIG. 2. In this embodiment, each first through hole O may have a diameter D approximately larger than or equal to 2 millimeters, and every two adjacent second through holes O may be spaced apart by a gap G approximately larger than or equal to 3 millimeters. It is noted that the diameter D and gap G are one of the ways to explain the empty spaces in the cover plate 120. The porosity can be another way to explain the empty spaces in the cover plate 120, where the porosity is the percentage of empty space in the cover plate 120 and, in this or some other embodiments, can be defined as the ratio of the total volume of the empty spaces divided by the total volume of the cover plate. In this embodiment, the porosity of the cover plate 120 may be approximately ranging between 20% and 50%.

In addition, in this embodiment, the first through hole O is a circular through hole, but the disclosure is not limited to the shape of the second through hole. For example, in other embodiments, the first through hole may be a square, triangular, or hexagonal through hole.

Figure 4:
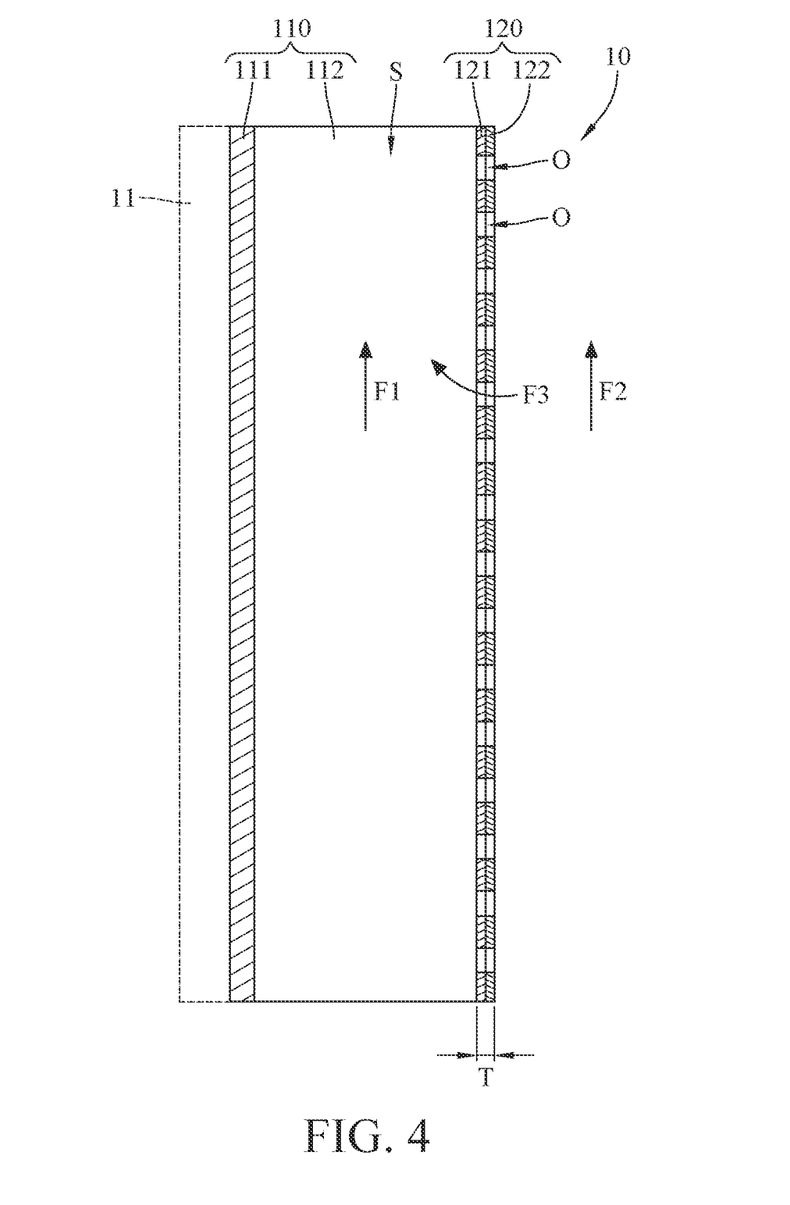
FIG. 4 is a cross-sectional view of the heat dissipation device in FIG. 1.

Please refer to FIG. 4. FIG. 4 is a cross-sectional view of the heat dissipation device in FIG. 1. The base 111 of the heat dissipation body 110 is in thermal contact with the heat source 11 so that heat generated by the heat source 11 will be transferred to the heat dissipation body 110 and thus will heat the fluid F1 in the vertical channels S, thereby causing the fluid F1 to flow upwards. Within a short time period, the heat generated by the heat source 11 will be transferred to the cover plate 120 via the heat dissipation body 110 and thus heating the fluid F2 outside the cover plate 120, thereby causing the fluid F2 to flow upwards. Since the first layer 121 has a higher thermal conductivity than the second layer 122, more heat will be transferred towards the fluid F1. As a result, the fluid F1 will flow faster than the fluid F2. According to the Bernoulli's equation, if the velocity increases, then the pressure decreases. Therefore, the higher velocity of the fluid F1 will result in a pressure in the vertical channels S lower than that in the space in which the fluid F2 flows, causing the air outside the vertical channels S to flow into the vertical channels S (e.g., fluid F3 shown in FIG. 4). Such movement of air is known as the stack effect.

Accordingly, during the operation of the heat source 11, the flow rate of the fluid flowing through the vertical channels S can be increased with the help of the first through holes O of the cover plate 120 and the different thermal conductivities between the first layer 121 and the second layer 122. The increased flow rate of the fluid in the vertical channels S can help improve the cooling efficiency of the heat dissipation device 10 to the heat source 11 under natural convection.

It is noted that the flow rate of the fluid F3 will be increased if any one of the porosity of the cover plate, the diameter D of the first through holes O, and the gap G between the first through holes O meets the aforementioned conditions.

Figure 5:
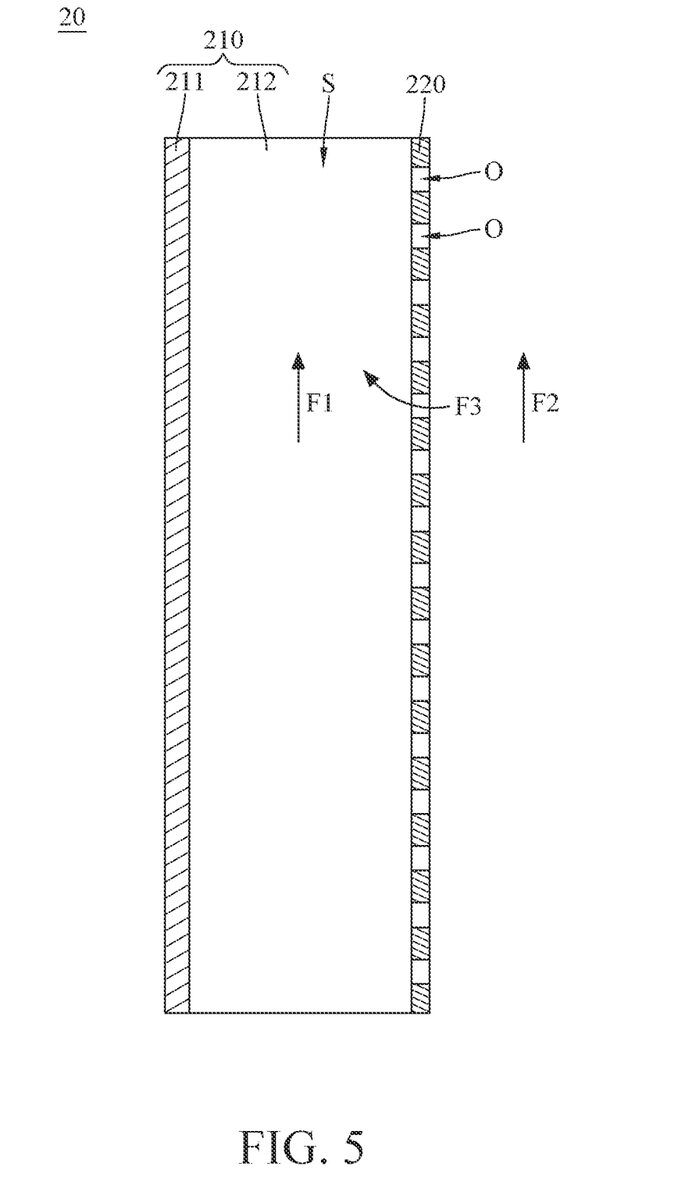
FIG. 5 is a cross-sectional view of a heat dissipation device according to a second embodiment of the disclosure.

Please refer to FIG. 5. FIG. 5 is a cross-sectional view of a heat dissipation device according to a second embodiment of the disclosure.

This embodiment provides a heat dissipation device 20 including a heat dissipation body 210 and a cover plate 220. The heat dissipation body 210 may include copper and have a thermal conductivity of approximately 390 W/mk to 401 W/mk. The heat dissipation body 210 includes a base 211 and a plurality of heat dissipation fins 212, and has a plurality of vertical channels S. Every two adjacent heat dissipation fins 212 are spaced apart by a vertical channel S. The heat dissipation body 210 and the heat dissipation body 110 of the previous embodiment are similar in configuration, so the heat dissipation body 210 will not be described in detail below.

The cover plate 220 is stacked on the heat dissipation fins 212, and the cover plate 220 and the base 211 are respectively located on two opposite sides of the heat dissipation fins 212. The cover plate 220 may include plastic and have a thermal conductivity lower than 1 W/mk. The cover plate 220 is stacked on a side of the heat dissipation fins 212 facing away from the base 211. In this embodiment, the thermal conductivity of the heat dissipation body 210 is at least one hundred times higher than that of the cover plate 220, but the disclosure is not limited thereto. In other embodiment, the thermal conductivity of the heat dissipation body may be at least twenty times higher than that of the cover plate. In addition, the cover plate 220 has a plurality of first through holes O connecting to some of or all of the vertical channels S.

The base 211 of the heat dissipation body 210 is in thermal contact with a heat source (not shown) so that heat generated by the heat source will be transferred to the heat dissipation body 210 and thus will heat the fluid F1 in the vertical channels S, thereby causing the fluid F1 to flow upwards. Within a short time period, the heat generated by the heat source will be transferred to the cover plate 220 via the heat dissipation body 210 and thus heating the fluid F2 outside the cover plate 220, thereby causing the fluid F2 to flow upwards. Since the heat dissipation body 210 has a higher thermal conductivity than the cover plate 220, more heat will be transferred toward the fluid F1. As a result, the fluid F1 will flow faster than the fluid F2. According to the Bernoulli's equation, if the velocity increases, then the pressure decreases. Therefore, the higher velocity of the fluid F1 will result in a pressure in the vertical channels S lower than that in the space where the fluid F2 flows, thereby causing the air outside the vertical channels S to flow into the vertical channels S (e.g. fluid F3 shown in FIG. 5).

Accordingly, during the operation of the heat source, the flow rate of the fluid flowing through the vertical channels S can be increased with the help of the first through holes O of the cover plate 220 and the different thermal conductivities between the heat dissipation body 210 and the cover plate 220. The increased flow rate of the fluid in the vertical channels S can help improve the cooling efficiency of the heat dissipation device 20 to the heat source.

Figure 6:
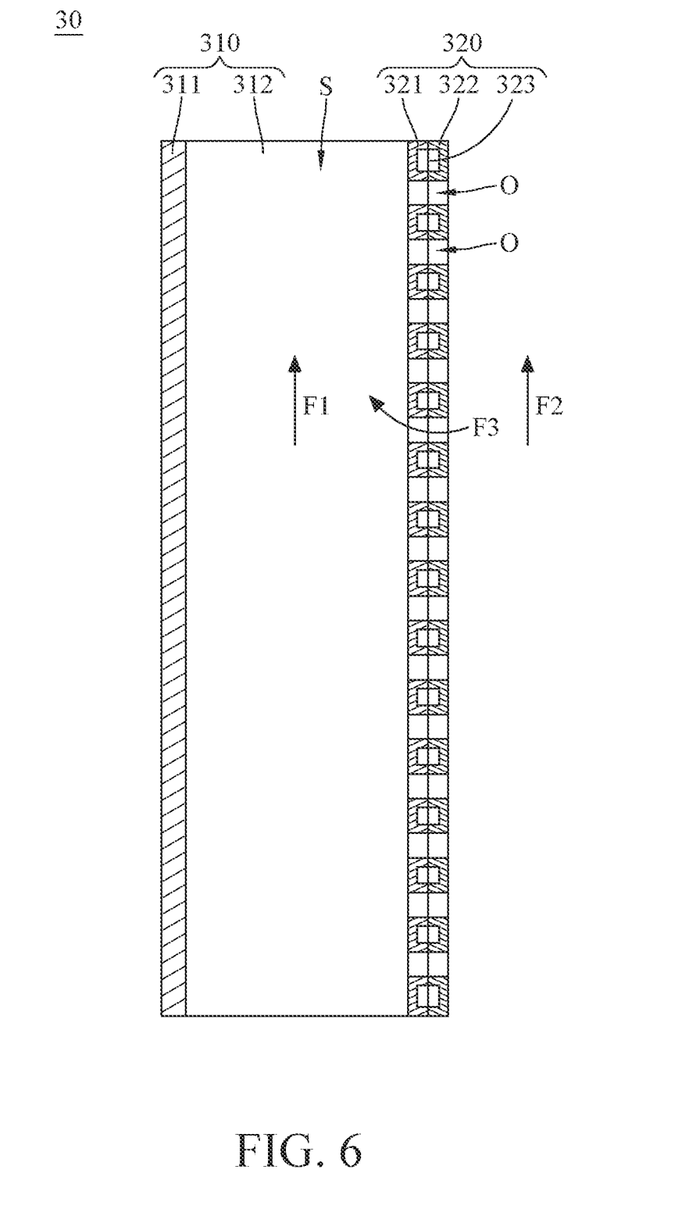
FIG. 6 is a cross-sectional view of a heat dissipation device according to a third embodiment of the disclosure.

Please refer to FIG. 6. FIG. 6 is a cross-sectional view of a heat dissipation device according to a third embodiment of the disclosure. This embodiment provides a heat dissipation device 30 including a heat dissipation body 310 and a cover plate 320. The heat dissipation body 310 includes a base 311 and a plurality of heat dissipation fins 312 and has a plurality of vertical channels S. Every two adjacent heat dissipation fins 312 are spaced apart by a vertical channel S. The heat dissipation body 310 and the heat dissipation body 110 of previous embodiment are similar in configuration, so the heat dissipation body 310 will not be described in detail below.

The cover plate 320 is stacked on the heat dissipation fins 312, and the cover plate 320 and the base 311 are respectively located on two opposite sides of the heat dissipation fins 312. In detail, the cover plate 320 includes a first layer 321, a second layer 322 and a thermal insulation part 323. The first layer 321 may include copper and have a thermal conductivity of approximately 390 W/mk to 401 W/mk. The first layer 321 is stacked on the heat dissipation body 310 to cover the vertical channels S. The second layer 322 may include plastic and have a thermal conductivity lower than 1 W/mk. The second layer 322 is stacked on a side of the first layer 321 facing away from the heat dissipation body 310; that is, the first layer 321 is located between the heat dissipation body 310 and the second layer 322. In this embodiment, the thermal conductivity of the first layer 321 is at least one hundred times higher than that of the second layer 322, but the disclosure is not limited thereto. In other embodiment, the thermal conductivity of the first layer may be at least twenty times higher than that of the second layer.

The thermal insulation part 323 is located between the first layer 321 and the second layer 322. Also, the thermal insulation part 323 may be an empty space filled with air, in such a case, the thermal insulation part 323 can be considered as an air layer and the thermal insulation part 323 may have a thermal conductivity of approximately 0.024 W/mk, but the disclosure is not limited thereto. For example, in other embodiments, the thermal insulation part may be a vacuum space, that is, the thermal insulation part has no air inside and can be considered as a vacuum layer.

The cover plate 320 has a plurality of first through holes O penetrating through the first layer 321 and the second layer 322 and connecting to some of or all of the vertical channels S.

The base 311 of the heat dissipation body 310 is in thermal contact with a heat source so that heat generated by the heat source will be transferred to the heat dissipation body 310 and thus will heat the fluid F1 in the vertical channels S, thereby causing the fluid F1 to flow upwards. Meanwhile, most of the heat in the fluid F1 is blocked by the thermal insulation part 323 of the cover plate 320, so the heat that is transferred to and makes the fluid F2 flow upwards is decreased. Also, because the thermal insulation part 323 is located between the first layer 321 and the second layer 322, and the first layer 321 has higher thermal conductivity than the second layer 322, more heat will be transferred to the fluid F1. As a result, the fluid F1 will flow faster than the fluid F2. According to the Bernoulli's equation, if the velocity increases, then the pressure decreases. Therefore, the higher velocity of the fluid F1 will result in a pressure in the vertical channels S lower than that in the space where the fluid F2 flows, thereby causing the air outside the vertical channels S to flow into the vertical channels S (e.g. fluid F3 shown in FIG. 6).

Accordingly, during the operation of heat source, the flow rate of the fluid flowing through the vertical channels S can be increased with the help of the first through holes O of the cover plate 320, the thermal insulation part 323 and the different thermal conductivities between the first layer 321 and the second layer 322. The increased flow rate of the fluid in the vertical channels S can help to improve the cooling efficiency of the heat dissipation device 30 to the heat source.

Figure 7:
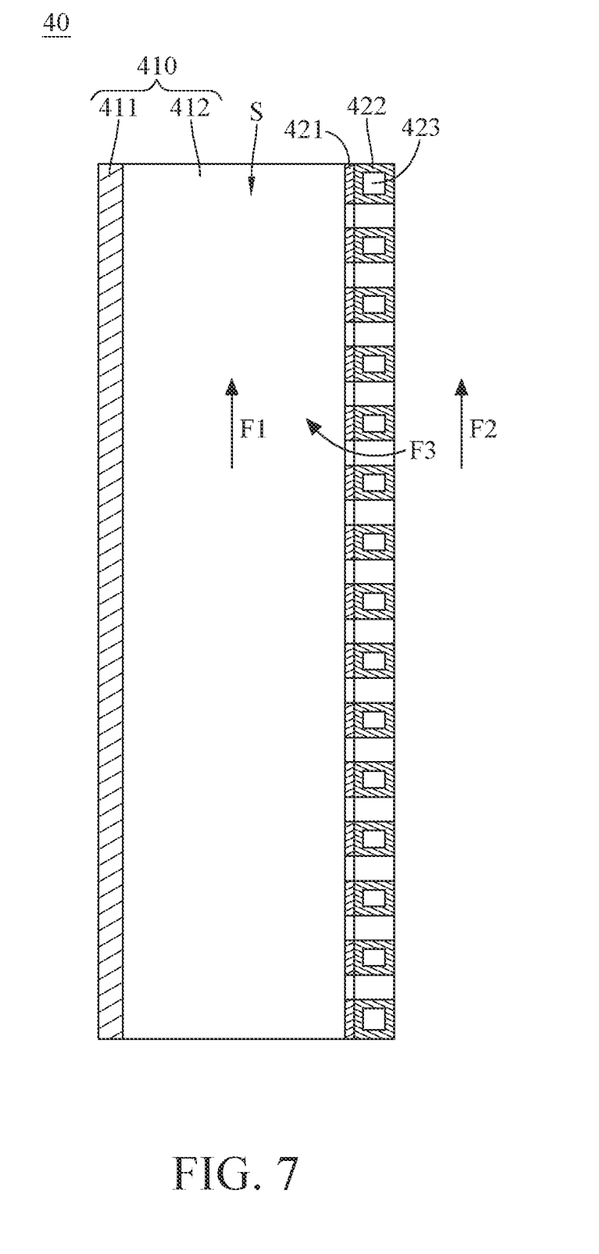
FIG. 7 is a cross-sectional view of a heat dissipation device according to a fourth embodiment of the disclosure.

Please refer to FIG. 7. FIG. 7 is a cross-sectional view of a heat dissipation device according to a fourth embodiment of the disclosure. This embodiment provides a heat dissipation device 40 including a heat dissipation body 410 and a cover plate 420. The heat dissipation body 410 includes a base 411 and has a plurality of vertical channels S. Every two adjacent heat dissipation fins 412 are spaced apart by a vertical channel S. The heat dissipation body 410 and the heat dissipation body 110 of previous embodiment are similar in configuration, so the heat dissipation body 410 will not be described in detail below.

The cover plate 420 is stacked on the heat dissipation fins 412 and the cover plate 420 and the base 411 are respectively located on two opposite sides of the heat dissipation fins 412. In detail, the cover plate 420 includes a first layer 421, a second layer 422 and a thermal insulation part 423. The first layer 421 may include copper and have a thermal conductivity of approximately 390 W/mk to 401 W/mk. The first layer 421 is stacked on the heat dissipation body 410 to cover the vertical channels S. The second layer 422 may include plastic and have a thermal conductivity lower than 1 W/mk. The second layer 422 is stacked on a side of the first layer 421 facing away from the heat dissipation body 410. In this embodiment, the thermal conductivity of the first layer 421 is at least one hundred times higher than that of the second layer 422, but the disclosure is not limited thereto; in other embodiments, the thermal conductivity of the first layer may be at least twenty times higher than that of the second layer.

The thermal insulation part 423 is located inside the second layer 422. Also, the thermal insulation part 423 may be an empty space filled with air, in such case, the thermal insulation part 423 can be considered as an air layer, and the thermal insulation part 423 may have a thermal conductivity of approximately 0.024 W/mk, but the disclosure is not limited thereto; in other embodiments, the thermal insulation part may be a vacuum space, that is, the thermal insulation part has no air inside and can be considered as a vacuum layer.

The cover plate 420 has a plurality of first through holes O penetrating through the first layer 421 and the second layer 422 and connecting to some of or all of the vertical channels S.

The base 411 of the heat dissipation body 410 is in thermal contact with a heat source so that heat generated by the heat source will be transferred to the heat dissipation body 410 and thus will heat the fluid F1 in the vertical channels S, thereby causing the fluid F1 to flow upwards. Meanwhile, most of the heat in the fluid F1 is blocked by the thermal insulation part 423 of the cover plate 420, so the heat that is transferred to and makes the fluid F2 flow upwards is decreased. Also, because the thermal insulation part 423 is located inside the second layer 422 and the first layer 421 has higher heat conductivity than the second layer 422, more heat will be transferred toward the fluid F1. As a result, the fluid F1 will flow faster than the fluid F2. According to the Bernoulli's equation, if the velocity increases, then the pressure decreases. Therefore, the higher velocity of the fluid F1 will result in a pressure in the vertical channels S lower than that of the space where the fluid F2 flows, thereby causing the air outside the vertical channels S to flow into the vertical channels S (e.g. fluid F3 shown in FIG. 7).

Accordingly, during the operation of the heat source, the flow rate of the fluid flowing through the vertical channels S can be increased with the help of the first through holes O of the cover plate 420, the thermal insulation part 423 and the difference thermal conductivities between the first layer 421 and the second layer 422. The increased flow rate of the fluid in the vertical channels S can help improve the cooling efficiency of the heat dissipation device 40 to the heat source.

Figure 8:
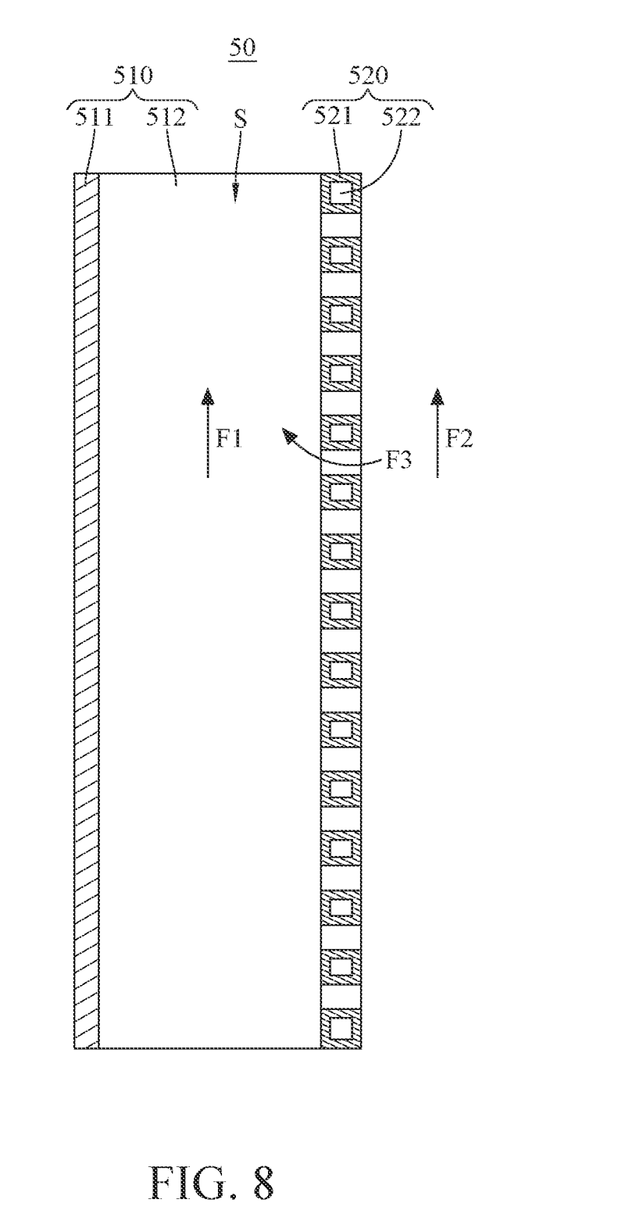
FIG. 8 is a cross-sectional view of a heat dissipation device according to a fifth embodiment of the disclosure.

Please refer to FIG. 8. FIG. 8 is a cross-sectional view of a heat dissipation device according to a fifth embodiment of the disclosure.

This embodiment provides a heat dissipation device 50 including a heat dissipation body 510 and a cover plate 520. The heat dissipation body 510 may include copper and have a thermal conductivity of approximately 390 W/mk to 401 W/mk. The heat dissipation body 510 includes a base 511 and a plurality of heat dissipation fins 512, and has a plurality of vertical channels S. Every two adjacent heat dissipation fins 512 are spaced apart by a vertical channel S. The heat dissipation body 510 and the heat dissipation body 110 of previous embodiment are similar in configuration, so the heat dissipation body 510 will not be described in detail below.

The cover plate 520 is stacked on the heat dissipation fins 512, and the cover plate 520 and the base 511 are respectively located on two opposite sides of the heat dissipation fins 512. The cover plate 520 includes an outer heat insulation part 521 and an inner heat insulation part 522. The outer heat insulation part 521 may include plastic and have a thermal conductivity lower than 1 W/mk. The outer heat insulation part 521 is stacked on a side of the heat dissipation fins 512 facing away from the base 511. The inner heat insulation part 522 may be an empty space filled with air, in such case, the inner heat insulation part 522 can be considered as an air layer, and the inner heat insulation part 522 may have a thermal conductivity of approximately 0.024 W/mk, but the disclosure is not limited thereto. For example, in other embodiments, the inner heat insulation part may be a vacuum space, that is, the inner heat insulation part has no air inside and can be considered as a vacuum layer. The cover plate 520 has a plurality of first through holes O connecting to some of or all of the vertical channels S.

In this embodiment, the inner heat insulation part 522 is to improve the thermal isolation of the cover plate 520 so as to increase the difference of heat amount between the fluid F1 and the fluid F2, thereby improving the cooling efficiency of the heat dissipation device 50 to the heat source.

Figure 9:
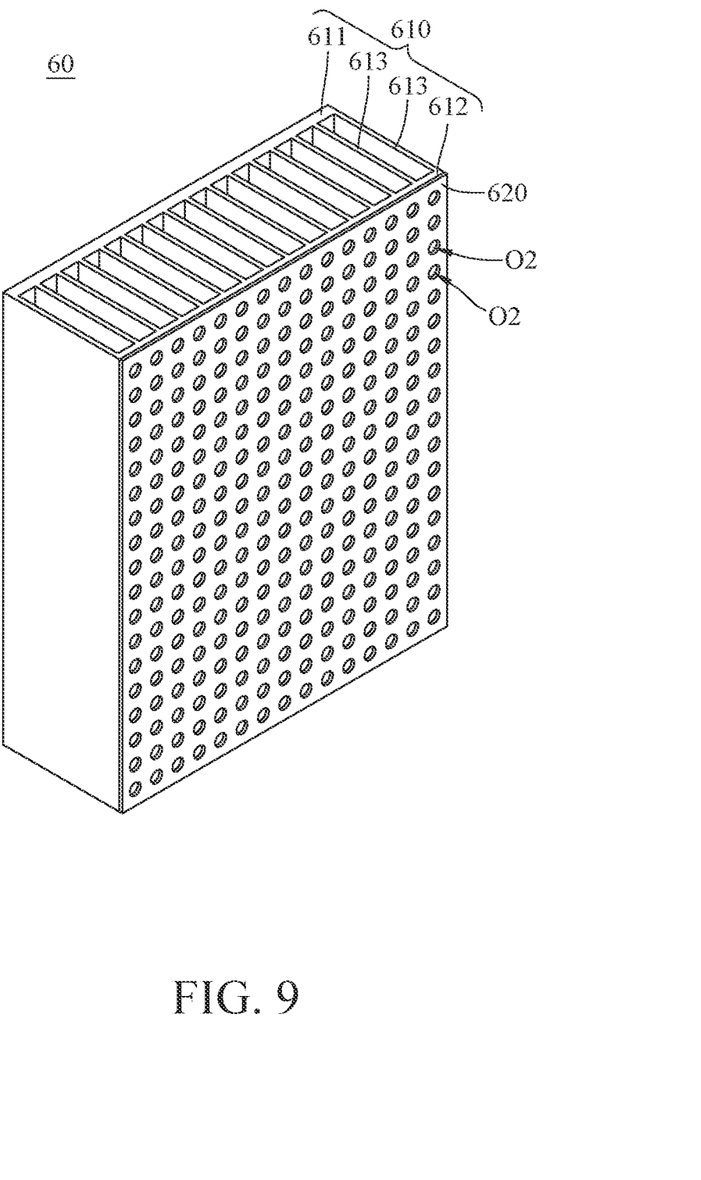
FIG. 9 is a perspective view of a heat dissipation device according to a sixth embodiment of the disclosure.
Figure 10:
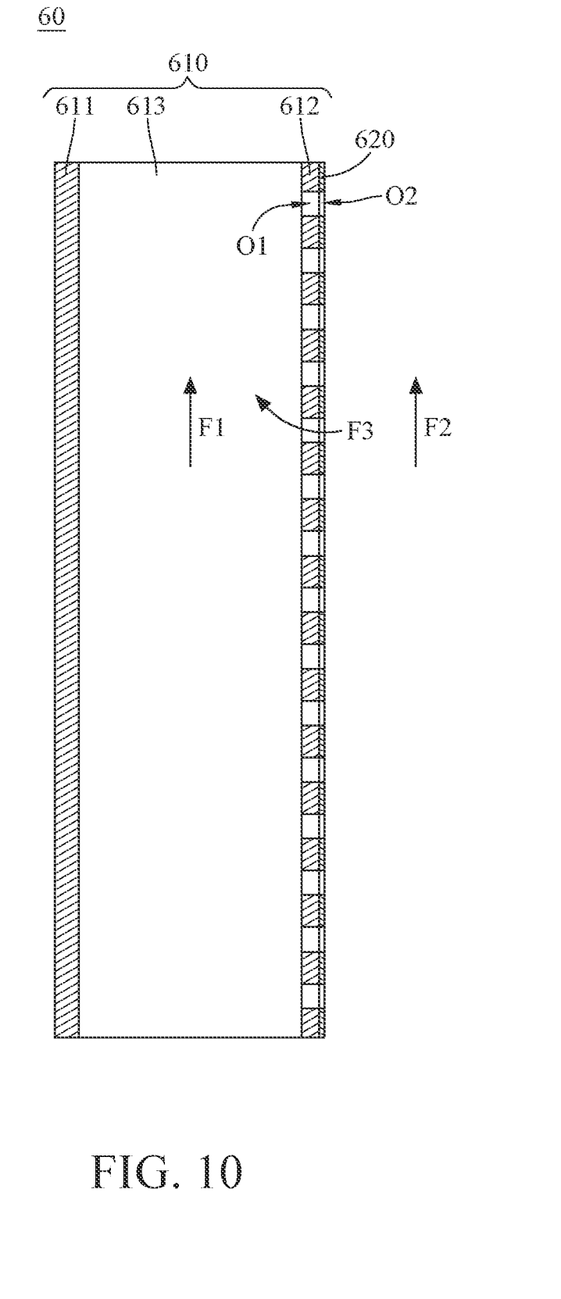
FIG. 10 is a cross-sectional view of the heat dissipation device in FIG. 9.

Please refer to FIG. 9 and FIG. 10. FIG. 9 is a perspective view of a heat dissipation device according to a sixth embodiment of the disclosure. FIG. 10 is a cross-sectional view of the heat dissipation device in FIG. 9.

This embodiment provides a heat dissipation device 60 including a heat dissipation body 610 and a heat insulation film 620. The heat dissipation body 610 may include copper and have a thermal conductivity of approximately 390 W/mk to 401 W/mk. The heat dissipation body 610 includes a first thermally conductive plate 611, a second thermally conductive plate 612 and a plurality of fins 613 that are integrally formed with one another. The fins 613 are located between the first thermally conductive plate 611 and the second thermally conductive plate 612. The first thermally conductive plate 611, the second thermally conductive plate 612 and the fins 613 form a plurality of vertical channels S therebetween. The first thermally conductive plate 611 is configured to be in thermal contact with a heat source. The second thermally conductive plate 612 has a plurality of first through holes O1 connecting to some of or all of the vertical channels S.

The heat insulation film 620 has a plurality of second through holes O2. The heat insulation film 620 is stacked on a side of the second thermally conductive plate 612 facing away from the first thermally conductive plate 611. The second through holes O2 are respectively connected to some of or all of the vertical channels S via the first through holes O1. The heat insulation film 620 may be insulation paint and may have a thermal conductivity lower than 0.03 W/mk.

The first thermally conductive plate 611 of the heat dissipation body 610 is in thermal contact with the heat source (not shown) so that heat generated by the heat source will be transferred to the heat dissipation body 610 and thus will heat the fluid F1 in the vertical channels S, thereby causing the fluid F1 to flow upwards. Meanwhile, most of the heat in the fluid F1 is blocked by the heat insulation film 620, so the heat that is transferred to and makes the fluid F2 flow upwards is decreased. With the help of the heat insulation film 620, more heat is transferred toward the fluid F1 than the fluid F2. As a result, the fluid F1 will flow faster than the fluid F2. According to the Bernoulli's principle, if the velocity increases, then the pressure decreases. Therefore, the higher velocity of the fluid F1 will result in a pressure in the vertical channels S lower than that of the space where the fluid F2 flows, thereby causing the air outside the vertical channels S to flow into the vertical channels S (e.g. fluid F3 shown in FIG. 10).

In this case, during the operation of the heat source, the flow rate of the fluid flowing through the vertical channels S can be increased with the help of the first through holes O of the second thermally conductive plate 612, the second through holes O2 of the heat insulation film 620, and the heat insulation film 620. The increased flow rate of the fluid flowing through the vertical channels S can help improve the cooling efficiency of the heat dissipation device 60 to the heat source.

Figure 11:
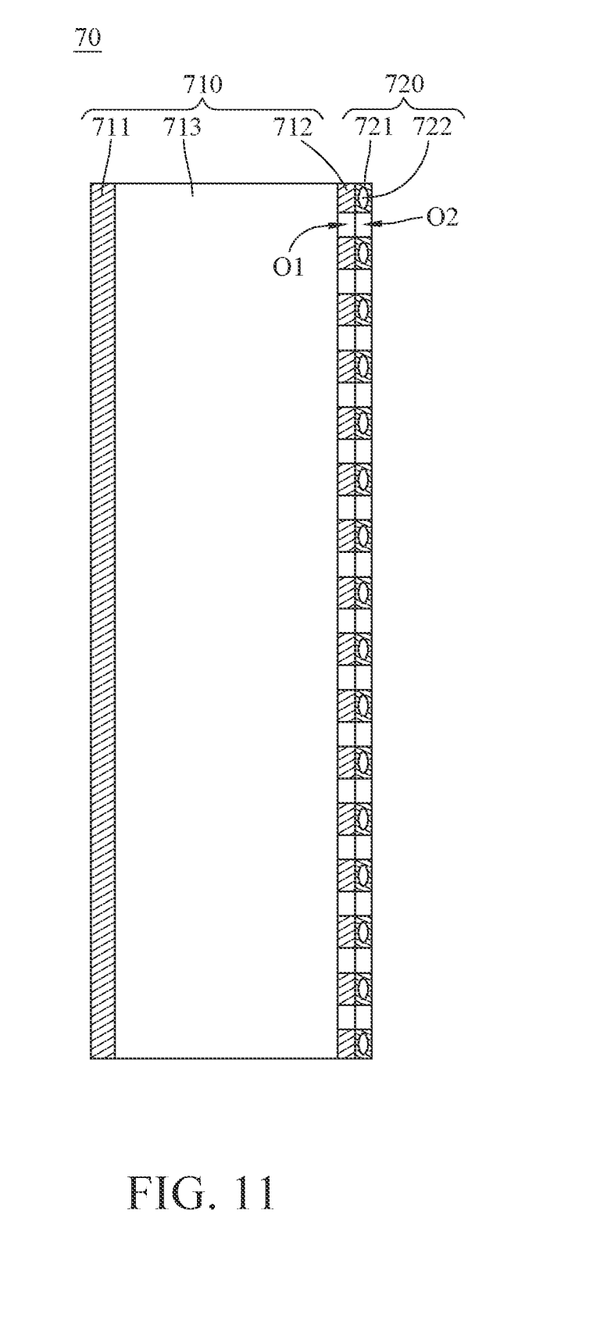
FIG. 11 is a cross-sectional view of a heat dissipation device according to a seventh embodiment of the disclosure.

Please refer to FIG. 11. FIG. 11 is a cross-sectional view of a heat dissipation device according to a seventh embodiment of the disclosure.

This embodiment provides a heat dissipation device 70 including a heat dissipation body 710 and a cover plate 720. The heat dissipation body 710 may include copper and have a thermal conductivity of approximately 390 W/mk to 401 W/mk. The heat dissipation body 710 includes a first thermally conductive plate 711, a second thermally conductive plate 712 and a plurality of fins 713 that are integrally formed with one another. These fins 713 are located between the first thermally conductive plate 711 and the second thermally conductive plate 712. The first thermally conductive plate 711, the second thermally conductive plate 712 and the fins 713 form a plurality of vertical channels S therebetween. The first thermally conductive plate 711 is configured to be in thermal contact with a heat source. The second thermally conductive plate 712 has a plurality of first through holes O1 connecting to some of or all of the vertical channels S.

The heat insulation film 720 has a plurality of second through holes O2. The heat insulation film 720 is stacked on a side of the second thermally conductive plate 712 facing away from the first thermally conductive plate 711. The second through holes O2 are respectively connected to some of or all of the vertical channels S via the first through holes O1. The heat insulation film 720 may be insulation print, and may have a thermal conductivity lower than 0.03 W/mk. The heat insulation film 720 includes an outer heat insulation part 721 and an inner heat insulation part 722. The outer heat insulation part 721 surrounds the inner heat insulation part 722 and a thermal conductivity of the outer heat insulation part 721 is higher than that of the inner heat insulation part 722. The outer heat insulation part 721 and the inner heat insulation part 722 may respectively be insulation print and an empty space filled with air, in such case, the inner heat insulation part 722 can be considered as an air layer, but the disclosure is not limited thereto. In other embodiments, the inner heat insulation part may be a vacuum space, that is, the inner heat insulation part has no air inside and can be considered as a vacuum layer.

According to the heat dissipation devices discussed above, due to the composite material of the cover plate or the heat dissipation body, or the thermal insulation part, the amount of heat transferred to the fluid inside the vertical channels will be more than that transferred to the fluid outside the vertical channels, such that the fluid inside the vertical channels will flow faster than the fluid outside the vertical channels. According to the Bernoulli's equation, the higher velocity of the fluid inside the vertical channels will result in a pressure lower than that in the space outside the vertical channels, and which will draw the air outside the vertical channels into the vertical channels to increase the flow rate of the fluid in the vertical channels. Therefore, during the operation of the heat source, the flow rate of the fluid flowing through the vertical channels can be increased. The increased flow rate of the fluid in the vertical channels can help improve the cooling efficiency of the heat dissipation device to the heat source under natural convection.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A heat dissipation device configured to be in thermal contact with a heat source, and the heat dissipation device comprising:
   a heat dissipation body having at least one vertical channel, wherein the heat dissipation body is configured to be in thermal contact with the heat source; and
   a cover plate stacked on the heat dissipation body, wherein the cover plate covers the at least one vertical channel, the cover plate comprises an outer heat insulation part and an inner heat insulation part, and the inner heat insulation part is enclosed in the outer heat insulation part to be isolated from outside the outer heat insulation part;
   wherein a thermal conductivity of the heat dissipation body is larger than a thermal conductivity of the cover plate, and the cover plate has at least one first through hole connecting to the at least one vertical channel.

2. The heat dissipation device according to claim 1, wherein the thermal conductivity of the heat dissipation body is at least twenty times higher than the thermal conductivity of the cover plate.

3. The heat dissipation device according to claim 2, wherein the thermal conductivity of the heat dissipation body is at least one hundred times higher than the thermal conductivity of the cover plate.

4. The heat dissipation device according to claim 1, wherein an extension direction of the at least one vertical channel is not perpendicular to a vertical direction.

5. The heat dissipation device according to claim 4, wherein the extension direction of the at least one vertical channel is parallel to the vertical direction.

6. The heat dissipation device according to claim 4, wherein the extension direction of the at least one vertical channel has an acute angle to the vertical direction.

7. The heat dissipation device according to claim 1, wherein a diameter of the at least one first through hole is larger than or equal to 2 millimeters.

8. The heat dissipation device according to claim 1, wherein a quantity of the at least one first through hole is plural, and every two of the first through holes that are adjacent to each other are spaced apart by a distance larger than or equal to 3 millimeters.

9. The heat dissipation device according to claim 1, wherein a porosity of the cover plate ranges between 20% and 50%.

10. The heat dissipation device according to claim 1, wherein a thickness of the cover plate ranges between 1 millimeter and 5 millimeters.

11. The heat dissipation device according to claim 1, wherein the inner heat insulation part is an air layer.

12. The heat dissipation device according to claim 1, wherein the inner heat insulation part is a vacuum layer.

13. The heat dissipation device according to claim 1, wherein the at least one first through hole is a circular, square, triangular or hexagonal through hole.

14. The heat dissipation device according to claim 1, wherein a quantity of the at least one vertical channel is plural, the heat dissipation body comprise a base and a plurality of heat dissipation fins, the plurality of heat dissipation fins protrude from the base, every two adjacent heat dissipation fins are spaced apart by one of the vertical channels, and the cover plate and the base are respectively located on two opposite sides of the plurality of heat dissipation fins.

15. The heat dissipation device according to claim 14, wherein the cover plate is connected to the plurality of heat dissipation fins by press fit, riveting or welding.

16. The heat dissipation device according to claim 14, wherein the cover plate is adhered to the plurality of heat dissipation fins via a thermally conductive adhesive.

17. A heat dissipation device configured to be in thermal contact with a heat source, and the heat dissipation device comprising:
  a heat dissipation body comprising a first thermally conductive plate, a second thermally conductive plate, and a plurality of fins that are integrally formed with one another, the plurality of fins located between the first thermally conductive plate and the second thermally conductive plate, the first thermally conductive plate, the second thermally conductive plate and the plurality of fins forming a plurality of vertical channels therebetween, the first thermally conductive plate configured to be in thermal contact with the heat source, and the second thermally conductive plate having a plurality of first through holes connecting to the plurality of vertical channels; and
  a heat insulation film having a plurality of second through holes, wherein the heat insulation film is stacked on a side of the second thermally conductive plate facing away from the first thermally conductive plate, and the plurality of second through holes of the heat insulation film are respectively connected to the plurality of vertical channels via the plurality of first through holes of the second thermally conductive plate.

18. The heat dissipation device according to claim 17, wherein a thermal conductivity of the heat dissipation body is at least twenty times higher than a thermal conductivity of the heat insulation film.

19. The heat dissipation device according to claim 18, wherein a thermal conductivity of the heat dissipation body is at least one hundred times higher than a thermal conductivity of the heat insulation film.

20. The heat dissipation device according to claim 17, wherein an extension direction of the plurality of vertical channels is not perpendicular to a vertical direction.

21. The heat dissipation device according to claim 20, wherein the extension direction of the plurality of vertical channels is parallel to the vertical direction.

22. The heat dissipation device according to claim 20, wherein the extension direction of the plurality of vertical channels has an acute angle to the vertical direction.

23. The heat dissipation device according to claim 17, wherein diameters of the plurality of first through holes and the plurality of second through holes are larger than or equal to 2 millimeters.

24. The heat dissipation device according to claim 17, wherein the plurality of first through holes are spaced apart from one another by a distance that is larger than or equal to 3 millimeters and the plurality of second through holes are spaced apart from one another by a distance that is larger than or equal to 3 millimeters.

25. The heat dissipation device according to claim 17, wherein a porosity of the second thermally conductive plate and a porosity of the heat insulation film range between 20% and 50%.

26. The heat dissipation device according to claim 17, wherein a total thickness of the second thermally conductive plate and the heat insulation film ranges between 1 millimeter and 5 millimeters.

27. The heat dissipation device according to claim 17, wherein the heat insulation film further comprising an outer heat insulation part and an inner heat insulation part, the outer heat insulation part surrounding the inner heat insulation part, and a thermal conductivity of the outer heat insulation part is higher than a thermal conductivity of the inner heat insulation part.

28. The heat dissipation device according to claim 27, wherein the inner heat insulation part is an air layer.

29. The heat dissipation device according to claim 27, wherein the inner heat insulation part is vacuum layer.

30. The heat dissipation device according to claim 17, wherein each of the plurality of first through holes and each of the plurality of second through holes are in circular, square, triangular or hexagonal shape.

* * * * *